(12) United States Patent
Tsuchida

(10) Patent No.: US 7,652,875 B2
(45) Date of Patent: Jan. 26, 2010

(54) DISPLAY DEVICE EQUIPPED WITH HARD DISK DRIVE

(75) Inventor: Shunichi Tsuchida, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 11/964,978

(22) Filed: Dec. 27, 2007

(65) Prior Publication Data

US 2008/0158802 A1    Jul. 3, 2008

(30) Foreign Application Priority Data

Dec. 27, 2006   (JP) .............................. 2006-353040

(51) Int. Cl.
*H05K 7/20*   (2006.01)

(52) U.S. Cl. .............................. 361/679.21; 361/679.37; 361/695; 361/704

(58) Field of Classification Search ................. 361/681, 361/679.21, 679.37, 695, 704
See application file for complete search history.

(56) References Cited

U.S. PATENT DOCUMENTS

| | | | |
|---|---|---|---|
| 5,831,816 A * | 11/1998 | Johns et al. | ............ 361/679.21 |
| 6,005,768 A * | 12/1999 | Jo | ........................ 361/679.34 |
| 6,532,152 B1 * | 3/2003 | White et al. | ................ 361/692 |
| 6,879,495 B2 * | 4/2005 | Jiang | ........................... 361/818 |
| 7,466,541 B2 * | 12/2008 | Takeda | ................... 361/679.27 |
| 2002/0135975 A1 * | 9/2002 | Schmidt | ..................... 361/681 |
| 2004/0169956 A1 * | 9/2004 | Oba et al. | ................ 360/97.02 |
| 2005/0206801 A1 * | 9/2005 | Miura | ........................ 349/58 |

FOREIGN PATENT DOCUMENTS

| | | |
|---|---|---|
| JP | 09-293985 | 11/1997 |
| JP | 2000-077877 | 3/2000 |
| JP | 2000-348479 | 12/2000 |
| JP | 2006-277896 | 10/2006 |
| JP | 2006-279835 | 10/2006 |
| KR | 0722043 B1 * | 5/2007 |

* cited by examiner

*Primary Examiner*—Jayprakash N Gandhi
*Assistant Examiner*—Ingrid Wright
(74) *Attorney, Agent, or Firm*—Pillsbury Winthrop Shaw Pittman, LLP

(57) ABSTRACT

According to one embodiment, a display device includes a housing, a chassis which holds a display panel inside the housing, and an HDD unit which is located behind the display panel. The HDD unit includes a case which has an opening portion opened toward rear of the display panel, a bracket which is provided inside the case, and an HDD which is housed inside the case by the bracket and has a heat-generating portion. The bracket has a heat-radiating portion which is thermally connected to the heat-generating portion. The heat-radiating portion is located on a side of the HDD, which is opposite to a side of the HDD facing the display panel, and exposed to inside of the housing through the opening portion.

17 Claims, 10 Drawing Sheets

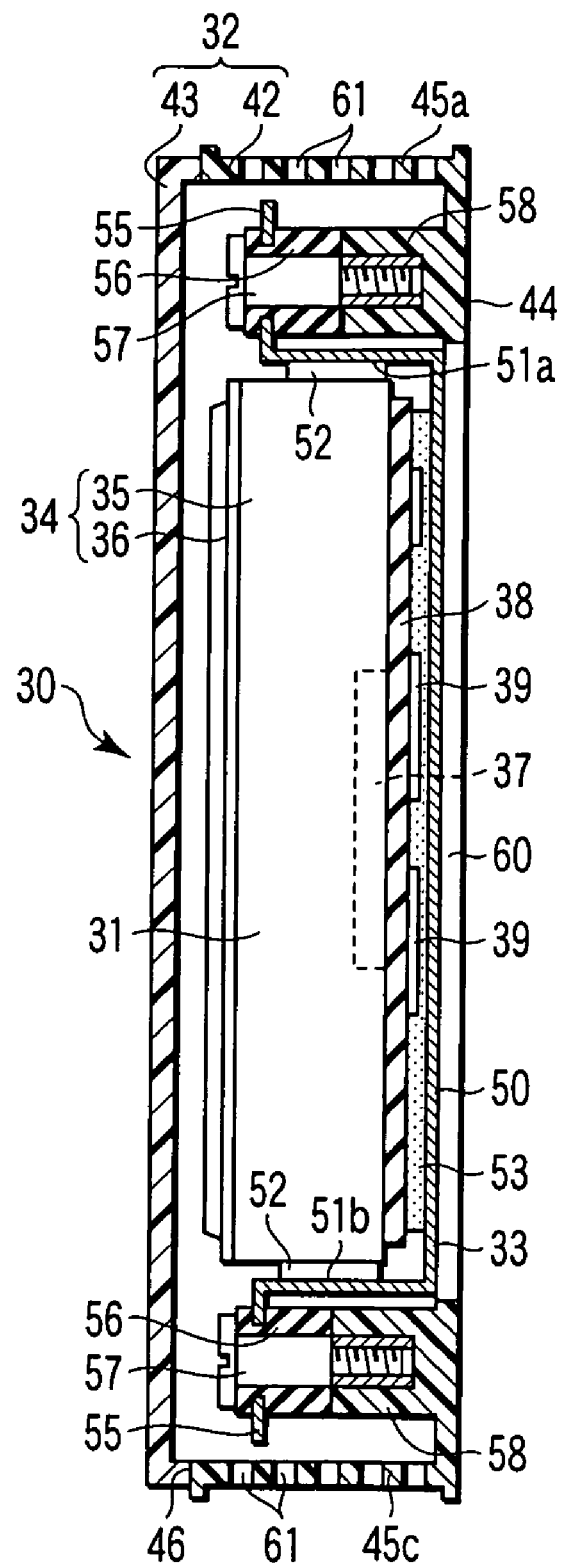
F I G. 6

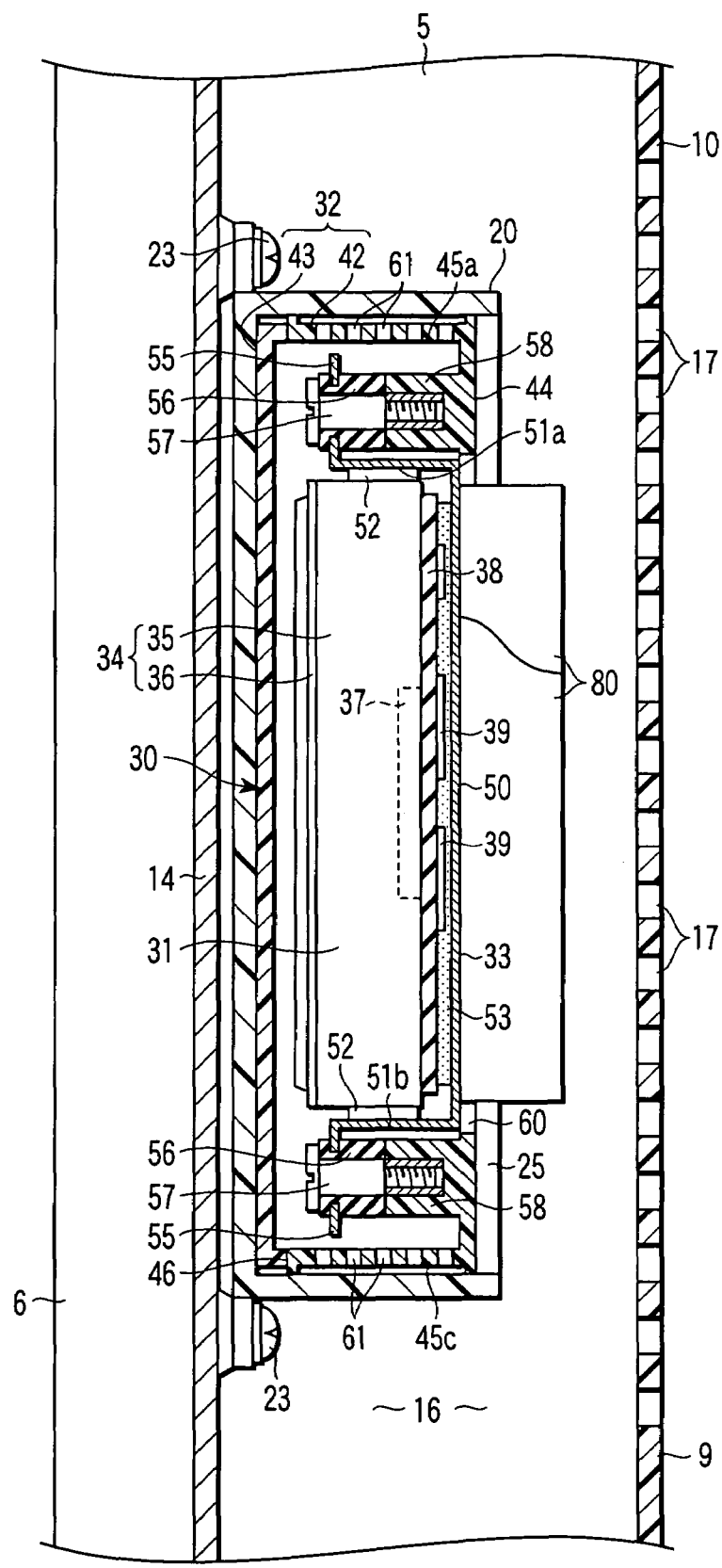
F I G. 10

DISPLAY DEVICE EQUIPPED WITH HARD DISK DRIVE

CROSS-REFERENCE TO RELATED APPLICATIONS

This application is based upon and claims the benefit of priority from Japanese Patent Application No. 2006-353040, filed Dec. 27, 2006, the entire contents of which are incorporated herein by reference.

BACKGROUND

1. Field

One embodiment of the present invention relates to a thin display device equipped with a hard disk drive, in particular, a structure for efficiently cool a hard disk drive.

2. Description of the Related Art

Among thin televisions such as liquid crystal televisions and plasma televisions, known are models equipped with a hard disk drive (hereinafter referred to as "HDD") which can record desired programs and rapidly retrieve and playback recorded programs.

Each HDD used for thin televisions is assembled as one HDD unit, in which the HDD is stored in a case having a relay connector, to protect it from static electricity and oscillation. Further, an HDD unit is detachably incorporated at the rear of a display panel of a thin television, to allow easy maintenance and exchange of the HDD.

HDDs have a plurality of IC chips mounted on a printed circuit board and a motor for disk drive. Motor and IC chips generate heat during operation of the HDD. If motor and IC chips are confined in a sealed space in the case, it is inevitable that the atmospheric temperature of the HDD is increased by heat generated by the motor and the IC chips. Increase in the temperature of HDDs has adverse influence on the life of the HDDs.

Therefore, for example, in a thin television disclosed in Jpn. Pat. Appln. KOKAI Pub. No. 2006-277896, a plurality of air vents are formed in a case housing an HDD, to ensure air ventilation in the case. Further, a thin television disclosed in Jpn. Pat. Appln. KOKAI Pub. No. 2006-279835 is equipped with a fan which forcibly air-cools an HDD.

In conventional thin televisions, the size of cases housing an HDD is limited not to prevent reduction in thickness of the thin televisions. Therefore, it is difficult to secure a sufficient space between the internal surface of the case and the HDD.

As a result, air ventilation inside the case deteriorates, and cooling air does not easily flow into the case, even when cooling air is supplied from a fan into the HDD unit. Therefore, sufficient cooling air is not guided around the heat-generating motor and IC chips. Thus, heat of the motor and IC chips may remain inside the case, and thin televisions are susceptible to further improvement in maintaining the operation circumstance temperature of HDDs at proper temperature.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 6 is an exemplary cross-sectional view of the HDD unit according to the first embodiment of the present invention.

FIG. 10 is an exemplary cross-sectional view illustrating a state where an HDD unit is inserted into an HDD holder in a second embodiment of the present invention.

DETAILED DESCRIPTION

Various embodiments according to the invention will be described hereinafter with reference to the accompanying drawings. In general, according to one embodiment of the invention, a display device comprises a housing; a display panel housed in the housing; a chassis which holds the display panel inside the housing; and an HDD unit which is housed inside the housing and located behind the display panel.

The HDD unit includes: (i) a case which is supported by the chassis and has an opening portion opened toward rear of the display panel; (ii) a bracket which is provided inside the case and has thermal conductivity; and (iii) an HDD which is housed inside the case by the bracket and has a heat-generating portion generating heat during operation.

The bracket has a heat-radiating portion which is thermally connected to the heat-generating portion of the HDD. The heat-radiating portion is located on a side of the HDD, which is opposite to a side of the HDD facing the display panel, and exposed to inside of the housing through the opening portion of the case.

Figure 1:
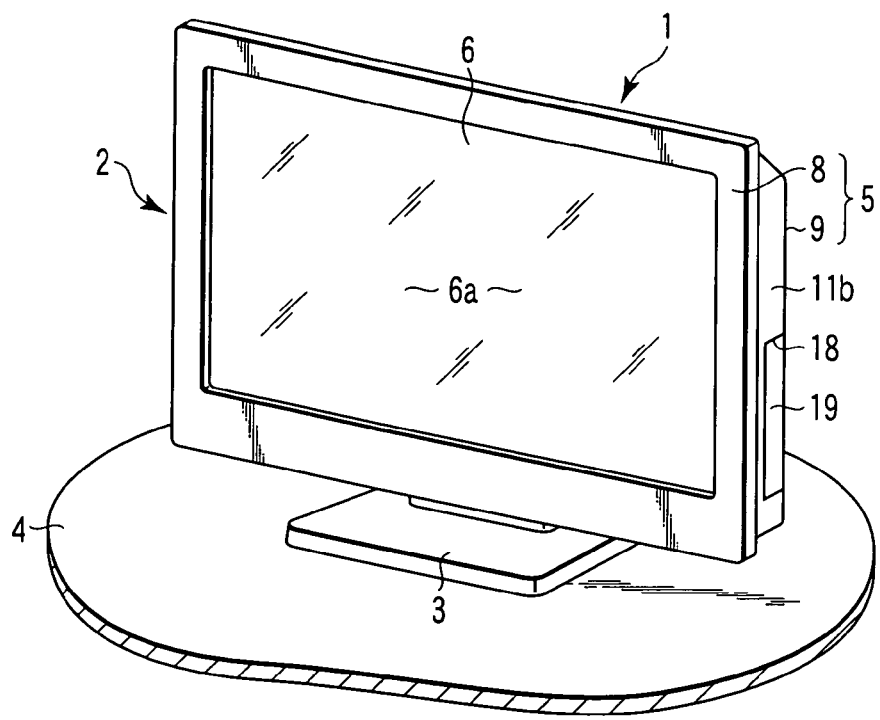
FIG. 1 is an exemplary perspective view of a liquid crystal television according to a first embodiment of the present invention.

FIG. 1 discloses a thin liquid crystal television 1 which is an example of a display device. The liquid crystal television 1 has a flat display main body 2. The display main body 2 is placed on a television base 4 with a stand 3 interposed therebetween. The display main body 2 is not always placed on the television base 4, but may be hung on an indoor standing wall by using hanging hardware (not shown).

The display main body 2 includes a housing 5 made of synthetic resin, and a flat liquid crystal display panel 6 housed in the housing 5. The liquid crystal display panel 6 has a display screen 6a, and a back light (not shown) which lights the display screen 6a. The display screen 6a is exposed to the front of the housing 5.

Figure 2:
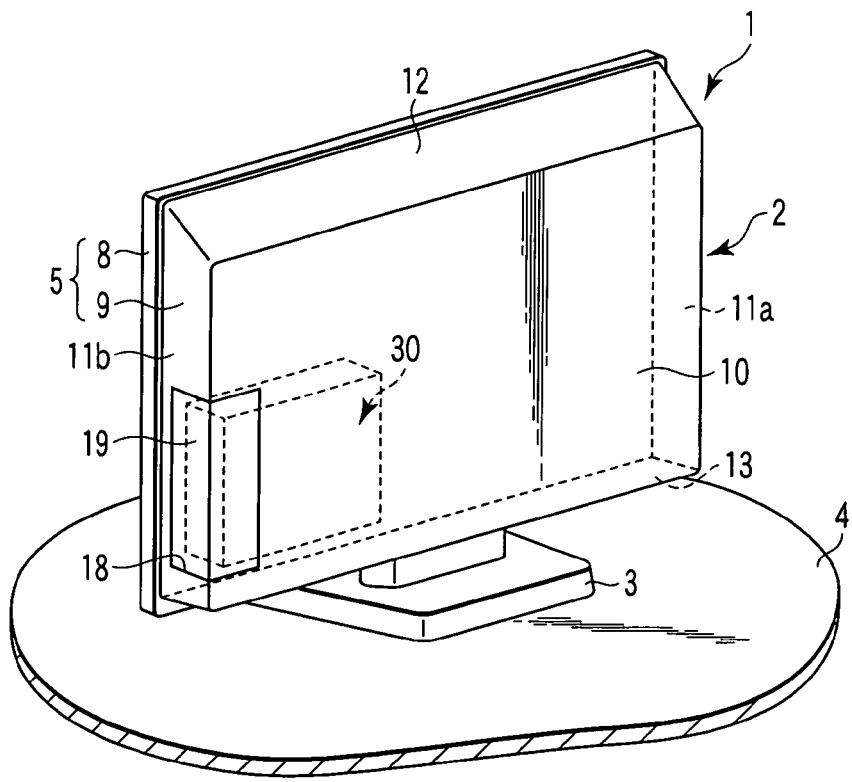
FIG. 2 is an exemplary perspective view of the liquid crystal television according to the first embodiment of the present invention, as viewed from the back side thereof.

As illustrated in FIGS. 1 and 2, the housing 5 has a front cover 8 and a back cover 9. The front cover 8 surrounds the liquid crystal display panel 6. The back cover 9 is supported by the stand 3, and covers the liquid crystal display panel 6 from behind.

The back cover 9 has a flat box shape having a rear wall 10, left and right side walls 11a and 11b, a top wall 12 and a bottom wall 13, and is opened toward the front of the housing 5. The rear wall 10 stands behind the liquid crystal display panel 6. The side walls 11a and 11b project from left and right side edges of the rear wall 10 toward the front of the housing 5. The top wall 12 projects from the top edge of the rear wall 10 toward the front of the housing 5. The bottom wall 13 projects from the bottom edge of the rear wall 10 toward the front of the housing 5.

Figure 3:
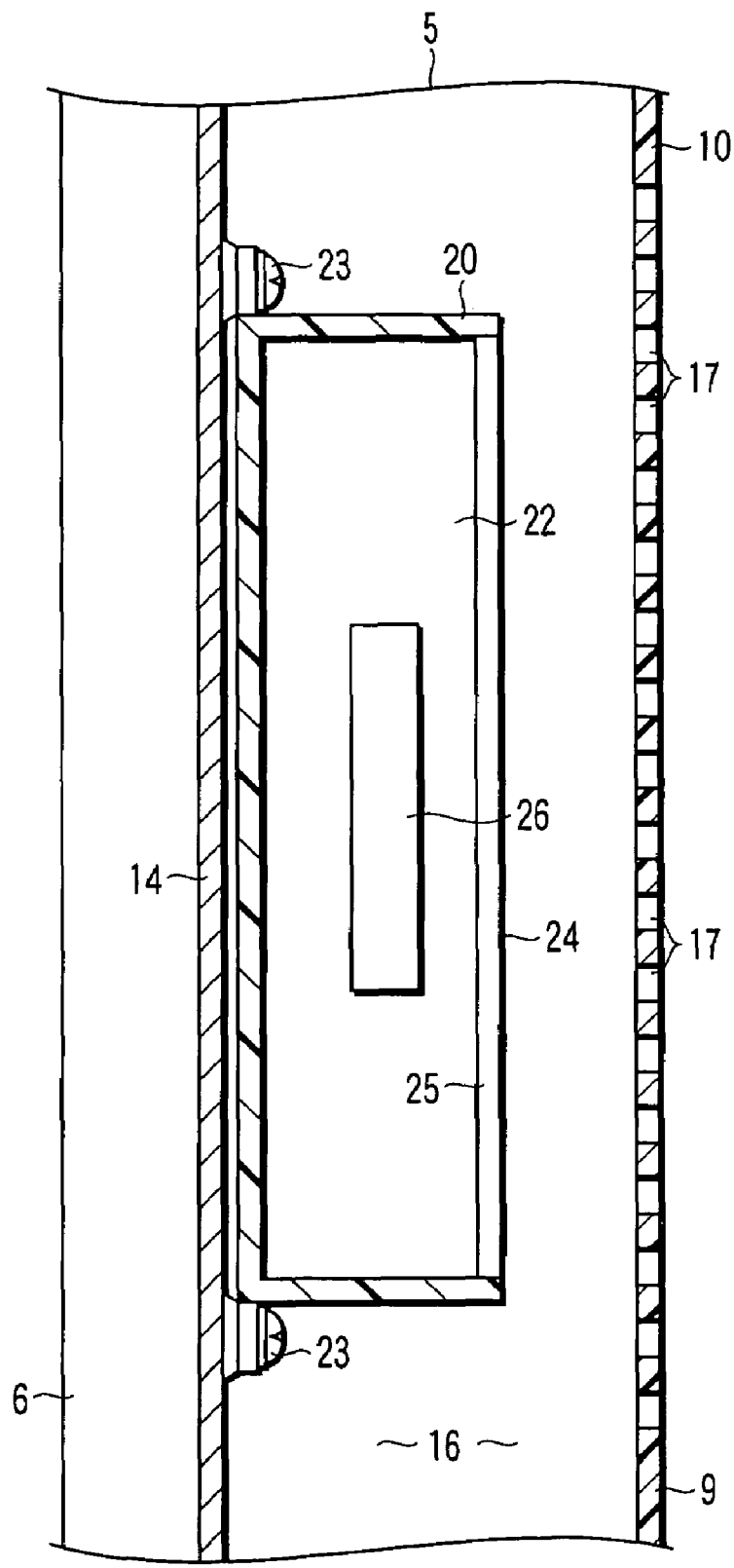
FIG. 3 is an exemplary cross-sectional view illustrating a state where an HDD holder is fixed on a chassis in the first embodiment of the present invention.

As illustrated in FIG. 3, a metal chassis 14 which supports the liquid crystal display panel 6 is housed inside the housing 5. The chassis 14 is superposed on the back surface of the liquid crystal display panel 6, and is opposed to the rear wall 10 of the back cover 9.

A receptacle 16 is formed inside the back cover 9. The receptacle 16 is located behind the chassis 14, and communicates with the outside of the housing 5 through a plurality of air vents 17 formed in the back cover 9.

As illustrated in FIGS. 1 and 2, an insertion hole 18 is formed in a corner portion defined by the rear wall 10 and the right side wall 11b of the back cover 9. The insertion hole 18 is opened to the receptacle 16, and shaped as a vertically long opening running along the vertical direction of the back cover 9. The insertion hole 18 is opened and closed with a lid 19.

Figure 4:
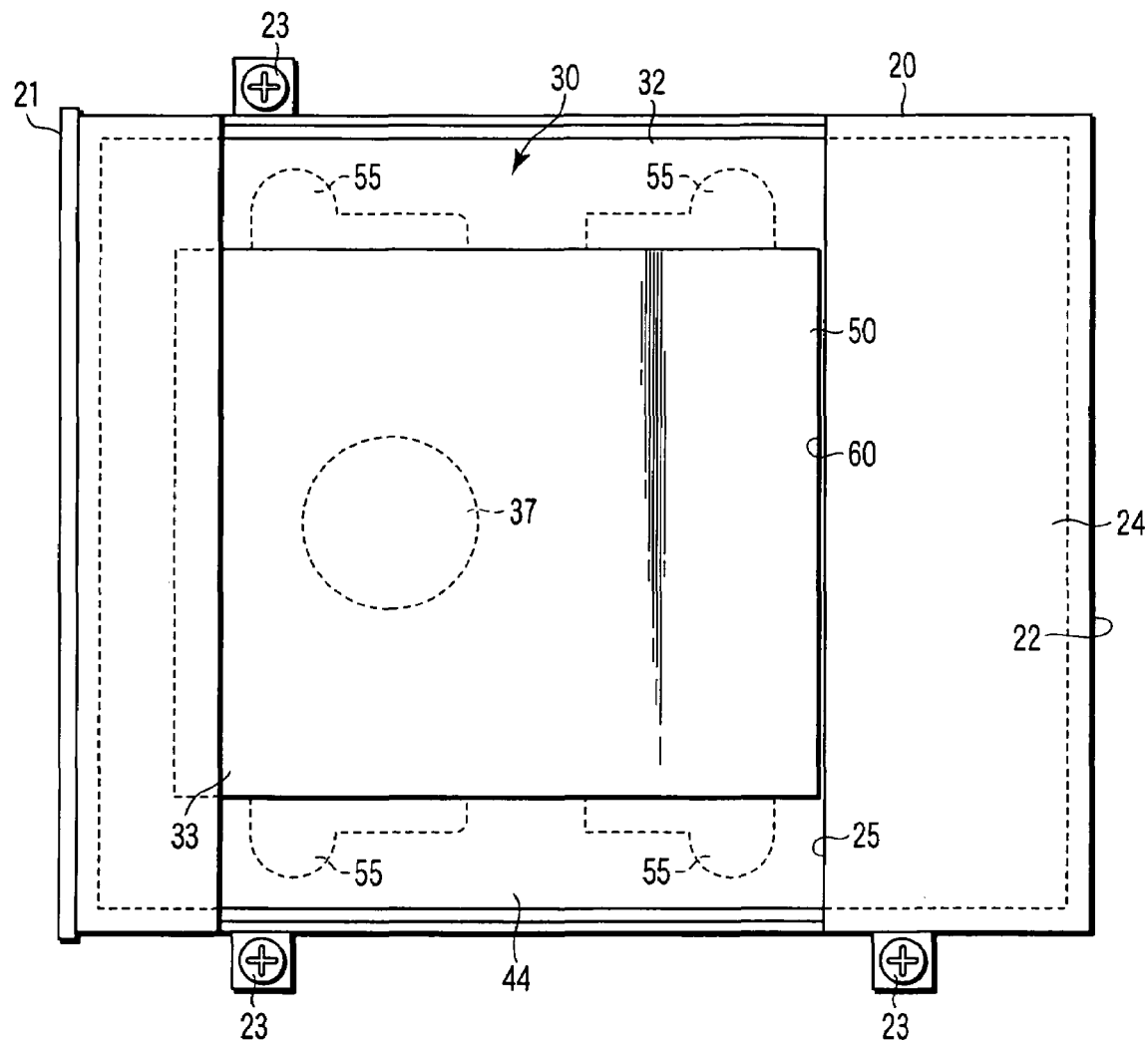
FIG. 4 is an exemplary front view illustrating a state where an HDD unit is inserted into the HDD holder in the first embodiment of the present invention.
Figure 5:
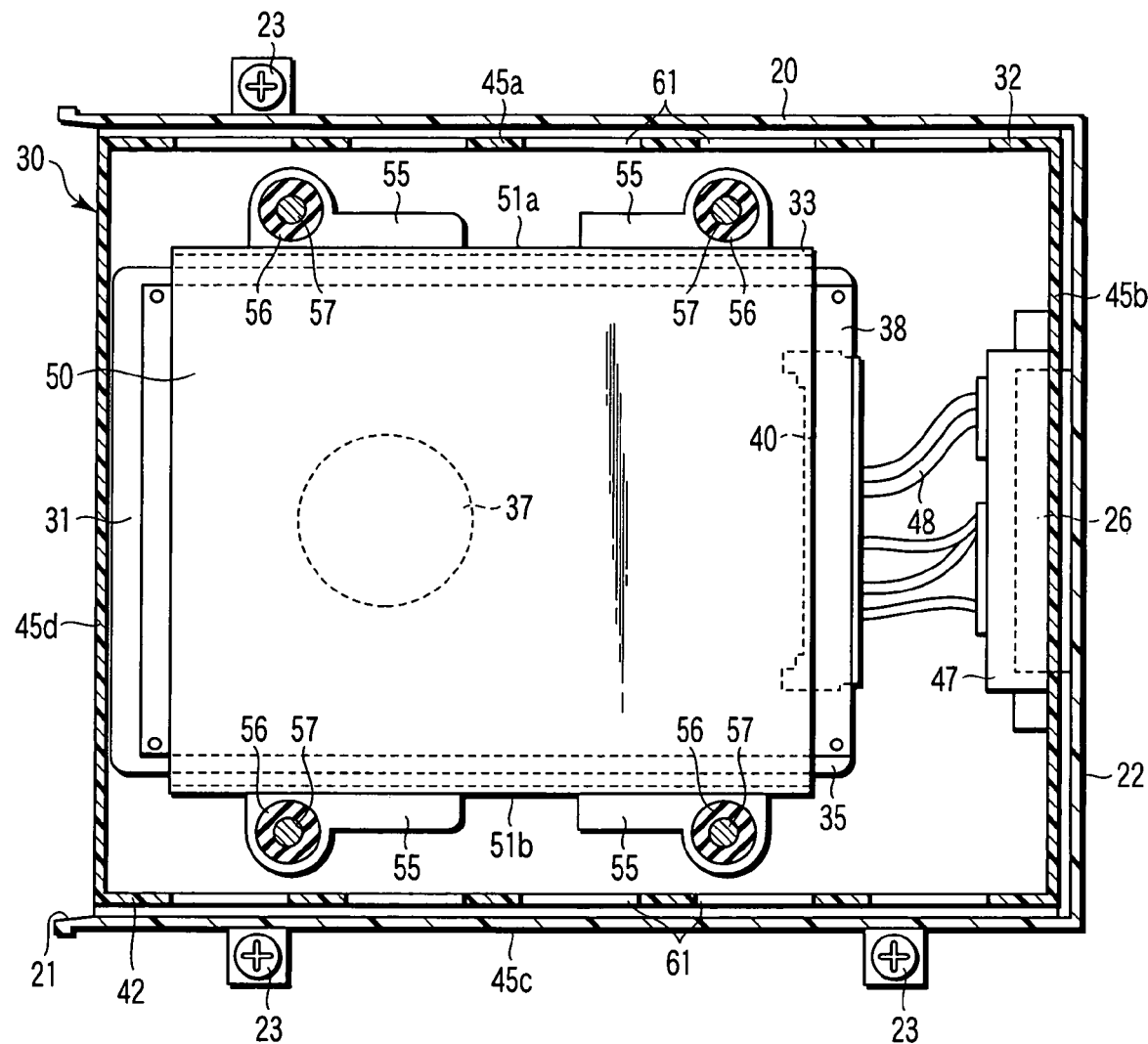
FIG. 5 is an exemplary cross-sectional view illustrating the state where the HDD unit is inserted into the HDD holder in the first embodiment of the present invention.

As illustrated in FIGS. 3 to 5, an HDD holder 20 formed of synthetic resin is provided in the receptacle 16 of the housing 5. The HDD holder 20 has a flat box shape, and has a mounting hole 21 and a connector supporting wall 22. The mounting hole 21 is located at one end of the HDD holder 20, and has a shape of a vertically long opening running along the vertical direction of the housing 5. The connector supporting wall 22 is located at the other end of the HDD holder 20, and opposed to the mounting hole 21.

The HDD holder 20 is fixed on the back surface of the chassis 14 by a plurality of screws 23. Thereby, the mounting hole 21 of the HDD holder 20 faces the insertion hole 18 of the back cover 9.

The HDD holder 20 has a rear end wall 24 which is located on a side opposite to the surface facing the chassis 14. The rear end wall 24 faces the rear wall 10 of the back cover 9. A rectangular cut-away window portion 25 is formed in the central portion of the rear end wall 24. The window portion 25 is opened to the receptacle 16.

A relay connector 26 is attached to the connector supporting wall 22 of the HDD holder 20. The relay connector 26 is electrically connected to a control circuit section of the liquid crystal television 1 through a cable (not shown).

Figure 7:
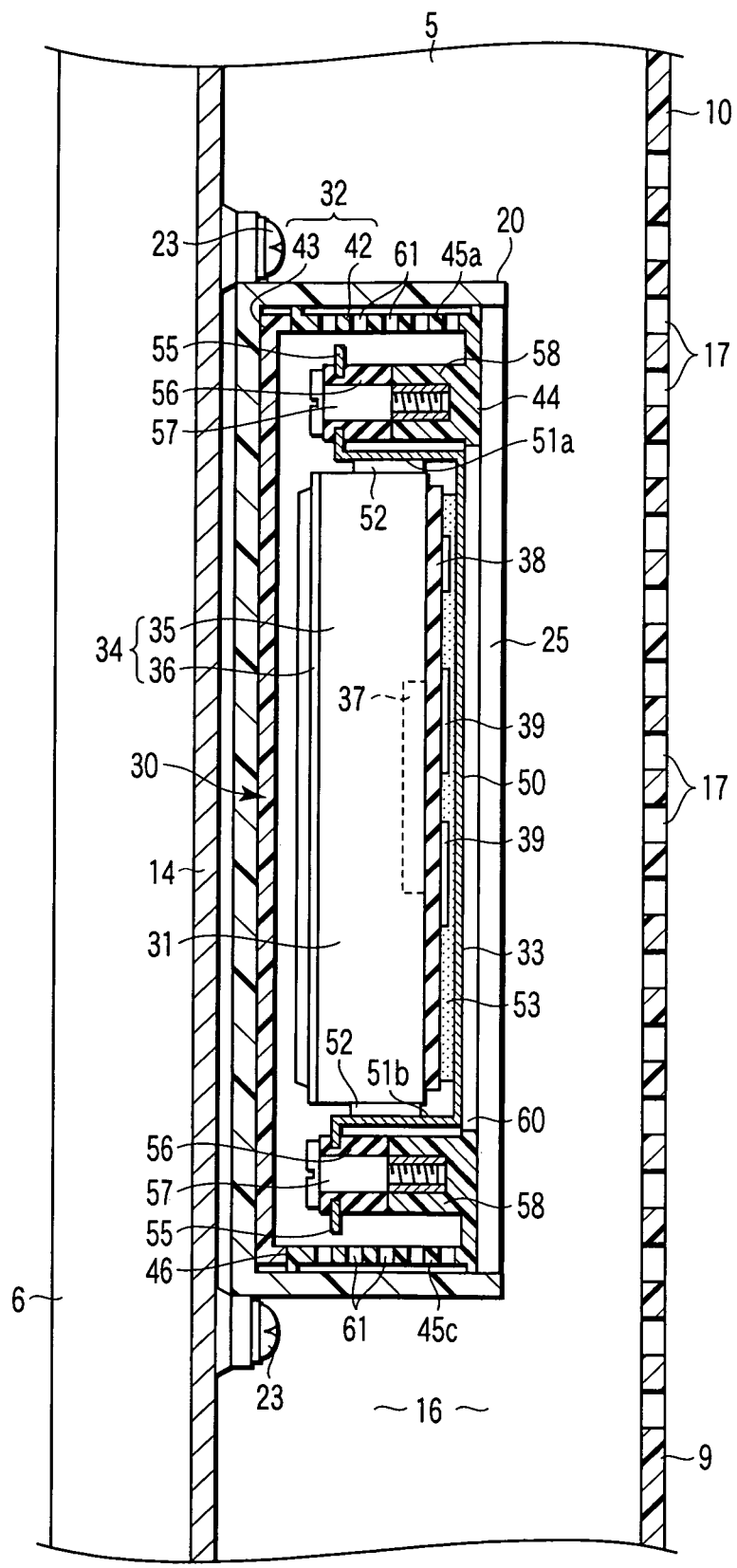
FIG. 7 is an exemplary cross-sectional view illustrating a state where the HDD unit is inserted into the HDD holder in the first embodiment of the present invention.

As illustrated in FIGS. 5 and 7, the HDD holder 20 detachably supports an HDD unit 30. The HDD unit 30 records, for example, desired programs, and promptly retrieves and plays back recorded programs. The HDD unit 30 is detachably inserted into the mounting hole 21 of the HDD holder 20 through the insertion hole 18 of the back cover 9, and held by the HDD holder 20 in the receptacle 16 of the housing 5.

As illustrated in FIGS. 5 and 6, the HDD unit 30 includes an HDD 31, a case 32 which is made of synthetic resin and houses the HDD 31, and a bracket 33 which holds the HDD 31 inside the case 32.

The HDD 31 has a metal main body 34. The main body 34 is formed of a base 35, and a top cover 36 fixed on the base 35. A clean sealed space (not shown) is formed between the base 35 and the top cover 36. The sealed space contains main components forming the HDD 31, such as a plurality of magnetic disks, a carriage using a magnetic head, and a spindle motor 37 which drives the magnetic disks. An end portion of the spindle motor 37 is exposed to the outside of the main body 34 through the bottom of the base 35.

A printed circuit board 38 is attached to the bottom of the base 35. The printed circuit board 38 is provided to control the HDD 31, and exposed to the outside of the main body 34. The printed circuit board 38 is equipped with a plurality of circuit components 39 such as IC chips, and a first HDD connector 40.

The spindle motor 37 and the circuit components 39 generate heat during operation of the HDD 31. Therefore, the spindle motor 37 and the circuit components 39 serve as examples of a heat-generating portion of the HDD 31. Heat generated by the spindle motor 37 and the circuit components 39 is conducted to the printed circuit board 38 and the main body 34 of the HDD 31.

As illustrated in FIG. 6, the case 32 housing the HDD 31 has a case main body 42 and a cover 43. The case main body 42 has a flat box shape which is larger than the HDD 31. The case main body 42 has a rectangular bottom wall 44, and four peripheral walls 45a, 45b, 45c, and 45d which stand from the peripheral edge of the bottom wall 44. The top edges of the peripheral walls 45a, 45b, 45c, and 45d defines a rectangular opening portion 46. The opening portion 46 is provided to introduce the HDD 31 into the case main body 42, and opposed to the bottom wall 44.

When the HDD unit 30 is inserted into the HDD holder 20, the peripheral wall 45b of the case main body 42 is located at the front end of the inserting direction. A second HDD connector 47 is attached to the peripheral wall 45b. The second HDD connector 47 is electrically connected to the first HDD connector 40 through a relay cable 48. The second HDD connector 47 is fitted with the relay connector 26 of the HDD holder 30, when the HDD unit 30 is inserted into the HDD holder 20.

The cover 43 is attached to the case main body 42 to cover the opening portion 46. The cover 43 is fixed onto the case main body 42 by, for example, special screws, to prevent a third party from removing the cover 43 from the case main body 42 without good reason.

Consequently, the HDD 31 is not taken out of the case 32 or exposed to the outside of the case 32, and thus undesirable damage to the HDD 31 is prevented.

The bracket 33 that holds the HDD 31 in the case 32 is formed of a metal material having excellent thermal conductivity, such as aluminum alloy. As illustrated in FIGS. 5 and 6, the bracket 33 has a heat-radiating portion 50, and a pair of support boards 51a and 51b.

The heat-radiating portion 50 has a flat rectangular board shape, and has a size corresponding to the HDD 31. One support board 51a stands from one side edge of the heat-radiating portion 50. The other support board 51b stands from the other side edge of the heat-radiating portion 50. Therefore, the support boards 51a and 51b are opposed to each other in the width direction of the HDD 31.

The main body 34 of the HDD 31 is interposed between the support boards 51a and 51b, and elastically supported by the support boards 51a and 51b through a plurality of first rubber dumpers 52. The printed circuit board 38 of the HDD 31 is interposed between the main body 34 of the HDD 31 and the heat-radiating portion 50 of the bracket 33.

A heat-conducting member 53 is interposed between the printed circuit board 38 and the heat-radiating portion 50 of the bracket 33. Thermal conductive grease or a flexible thermal conductive sheet or the like can be used as the heat-conducting member 53. The heat-conducting member 53 thermally connects the heat-generating circuit components 39 with the heat-radiating portion 50, and the printed circuit board 38 with the heat-radiating portion 50.

Therefore, heat generated by the spindle motor 37 and the circuit components 39 during operation of the HDD 31 is conducted to the heat-radiating portion 50 of the bracket 38 through the heat-conducting member 53. In other words, existence of the heat-conducting member 53 eliminates space, which prevents thermal conduction, between the HDD 31 and the heat-radiating portion 50.

As illustrated in FIGS. 5 to 7, a pair of flange portions 55 are formed on a tip end of each of the support boards 51a and 51b of the bracket 33. Each flange portion 55 is provided with a cylindrical second rubber damper 56. The second rubber dampers 56 projects from the respective flange portions 55 toward the heat-radiating portion 50 of the bracket 33.

A fixing screw 57 pierces through the central portion of each second rubber damper 56. The fixing screws 57 are fixed into four seat portions 58 projecting from the heat-radiating portion 50. Thereby, the second rubber dampers 56 are interposed between the flange portions 55 and the seat portions 58, and elastically hold the bracket 33 in the case main body 42 together with the HDD 31.

Figure 9:
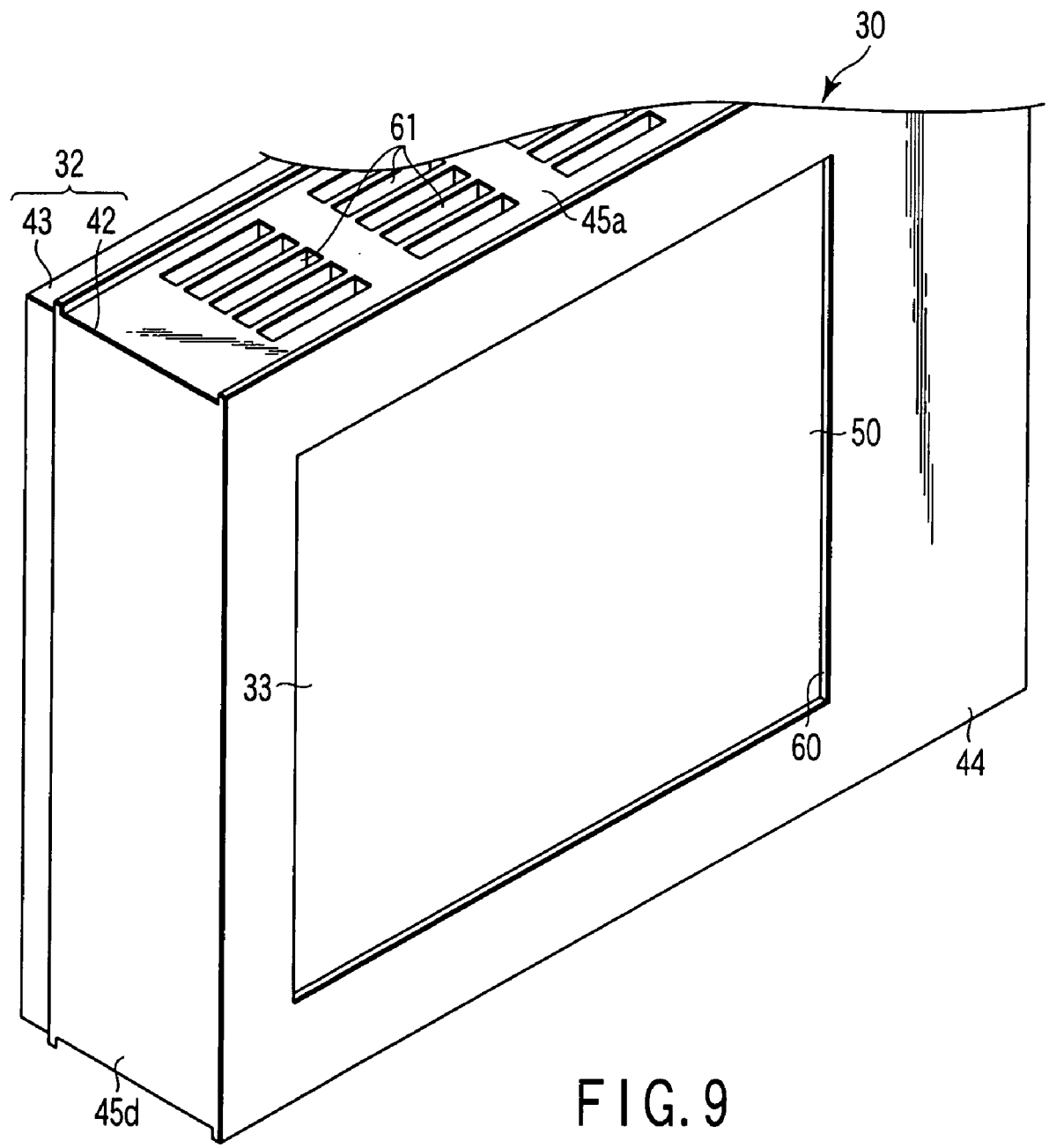
FIG. 9 is an exemplary perspective view of the HDD unit according to the first embodiment of the present invention.

In the state where the bracket 33 is held in the case main body 42, the heat-radiating portion 50 of the bracket 33 is interposed between the HDD 31 and the bottom wall 44 of the case main body 42. As illustrated in FIG. 9, a rectangular opening portion 60 is formed in the bottom wall 44 of the case main body 42. The opening portion 60 has a size corresponding to the heat-radiating portion 50 of the bracket 33, and faces the heat-radiating portion 50. The heat-radiating portion 50 is exposed to the outside of the case 32 through the opening portion 60.

Further, a plurality of heat-radiating ports 61 each having a slit shape are formed in the peripheral wall 45a serving as the top surface of the case main body 40 and the peripheral wall 45c serving as the bottom wall of the case main body 40.

The HDD unit 30 is detachably inserted through the insertion hole 18 of the back cover 9 into the mounting hole 21 of the HDD holder 20. In the insertion, as illustrated in FIGS. 5 to 7, the HDD 31 is held in a portrait-oriented state, in which the printed circuit board 38 faces the rear wall 10 of the back cover 9, in the case 32. Further, the case 32 of the HDD unit 30 is held in a portrait-oriented state, in which the opening portion 60 faces the rear wall 10 of the back cover 9, in the HDD holder 20.

When the case 32 of the HDD unit 30 is inserted into the HDD holder 20, the second HDD connector 47 is fitted with the relay connector 26 of the HDD holder 20. Thereby, the HDD 31 is electrically connected to the control circuit section of the liquid crystal television 1. Further, as illustrated in FIG. 4, the opening portion 60 of the case 32 is located on the window portion 25 of the HDD holder 20. Therefore, the opening portion 60 is not covered with the HDD holder 20.

Therefore, as illustrated in FIG. 7, when the HDD unit 30 is housed in the receptacle 16 of the housing 5, the heat-radiating portion 50 of the bracket 30, which receives heat of the HDD 31, is exposed to the receptacle 16 from the case 32, on the side of the HDD 31 opposite to the liquid crystal display panel 6.

Figure 8:
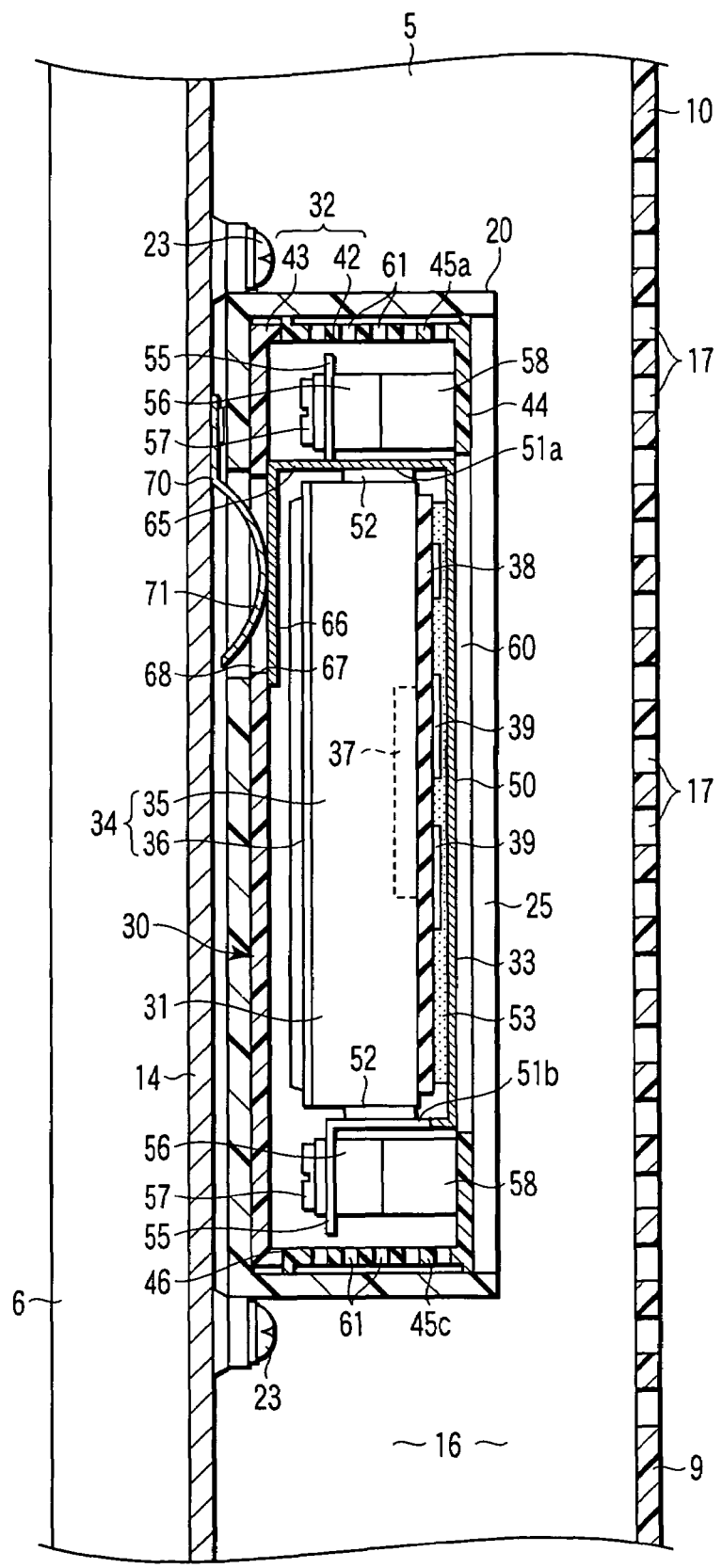
FIG. 8 is an exemplary cross-sectional view illustrating a state where a bracket of the HDD unit is grounded on the chassis through a leaf spring in the first embodiment of the present invention.

As illustrated in FIG. 8, the bracket 33 supporting the HDD 31 has an extending portion 65 for grounding. The extending portion 65 extends from a distal end of one support board 51a toward the chassis 14. The extending portion 65 has a contact piece 66. The contact piece 66 is located between the top cover 36 of the HDD 31 and the cover 43 of the case 32.

The cover 43 has a through hole 67 which exposes the contact piece 66 to the outside of the case 32. The through hole 67 is aligned with a connecting hole 68 formed in the HDD holder 20, when the HDD unit 30 is inserted in the HDD holder 20. Therefore, the contact piece 66 is opposed to the chassis 14 through the through hole 67 and the connecting hole 68.

A metal leaf spring 70 is attached to the back surface of the chassis 14. The leaf spring 70 is an example of a spring member, and has a contact element 71 which is elastically deformable and curved like an arc. The contact element 71 projects toward the inside of the HDD holder 20 through the through hole 67 and the connecting hole 68.

When the HDD unit 30 is inserted into the HDD holder 20, the contact element 71 of the leaf spring 70 slidably contacts the cover 43 of the case 32. When the HDD unit 30 is inserted into the HDD holder 20 to a position where the contact element 71 of the cover 43 is aligned with the connecting hole 68 of the HDD holder 20, the contact element 71 elastically contacts the contact piece 66 of the bracket 33.

By the contact, the bracket 33 supporting the HDD 31 is grounded through the leaf spring 70, and measures against noise of the HDD 31 are implemented.

In the first embodiment of the present invention described above, when the HDD 31 is operated, the spindle motor 37 and the circuit components 39 generate heat. Heat of the spindle motor 37 and the circuit components 39 is conducted to the heat-conducting member 53 directly or through the printed circuit board 38, and conducted from the heat-conducting member 53 to the heat-radiating portion 50 of the bracket 33.

The heat-radiating portion 50 is located on the side of the HDD 31, which is opposite to the side facing the liquid crystal display panel 6, and exposed to the outside of the case 32 through the opening portion 60 of the case 32 and the window portion 25 of the HDD holder 20. Therefore, heat of the HDD 31 conducted to the heat-radiating portion 50 is relieved by natural air cooling from the heat-radiating portion 50 to the outside of the case 32, without being obstructed by the liquid crystal display panel 6. The heat relieved to the outside of the case 32 is emitted to the outside of the display main body 2 through the air vents 17 opened in the back cover 9 and the heat-radiating ports 61.

According to the above structure, the bracket 33 supporting the HDD 31 also functions as a heat sink, and thus the heat-radiating property of the HDD 31 is increased by using the bracket 33. Therefore, heat of the HDD 31 does not easily remain inside the case 32.

Further, the printed circuit 38 which receives heat of the circuit components 39 and the spindle motor 37 is located distant from the liquid crystal display panel 6, and thus the printed circuit board 38 is less influenced by heat generated by the backlight of the liquid crystal display panel 6.

As a result, a sufficient capability for cooling the HDD 31 is secured, without a fan which forcibly cools the HDD 31. Therefore, a cooling fan is eliminated, and thus annoying operation noise of a cooling fan is eliminated, and reduction in noise is achieved.

In addition, since a cooling fan is unnecessary, the cost of the liquid crystal television 1 is reduced, and power consumption of the liquid crystal television 1 is reduced.

Further, since the bracket 33 is provided with the extending portion 65 extending toward the chassis 14, the contact piece 66 of the extending portion 65 can be brought into contact with the leaf spring 70 fixed on the chassis 14.

Therefore, although the main part of the bracket 33 is located on the other side of the HDD 31 opposite to the chassis 14, the bracket 33 supporting the HDD 31 can be grounded through the leaf spring 70. Therefore, it is possible to take measures against noise of the HDD 31.

The present invention is not limited to the above first embodiment, but can be variously modified and carried out within the range not departing from the gist of the invention.

FIG. 10 discloses a second embodiment of the present invention.

The second embodiment is different from the first embodiment in the structure of the bracket 33. The other parts of the structure of the liquid crystal television 1 according to the second embodiment are the same as those in the first embodiment. Therefore, constituent elements of the second embodiment which are the same as those in the first embodiment are denoted by the same respective reference numerals, and explanations thereof are omitted.

As illustrated in FIG. 10, a bracket 33 has a plurality of heat-radiating fins 80. The heat-radiating fins 80 are formed as one unitary piece with the back surface of a heat-radiating portion 50 of the bracket 33. The heat-radiating fins 80 extend in, for example, the height direction of the housing 5, and are arranged at intervals in the width direction of the housing 5.

The heat-radiating fins 80 pierce through the opening portion 60 of the case 32, and project to the rear of the case 32. The projecting ends of the heat-radiating fins 80 are exposed to the receptacle 16 of the housing 5.

In the case of providing the bracket 33 with the heat-radiating fins 80, it is necessary to form a notch extending from an opening end of the mounting hole 21 to the window portion 25 in the HDD holder 20, to avoid interference between the HDD holder 20 and the heat-radiating fins 80.

According to the second embodiment having the above structure, the heat-radiating fins 80 increase the heat-radiating area of the heat-radiating portion 50, and the contact area of the heat-radiating portion 50 with the air. Therefore, heat of the HDD 31 conducted to the heat-radiating portion 50 is efficiently relieved to the outside of the case 32, and the capability for cooling the HDD 31 can be further enhanced.

Figure 11:
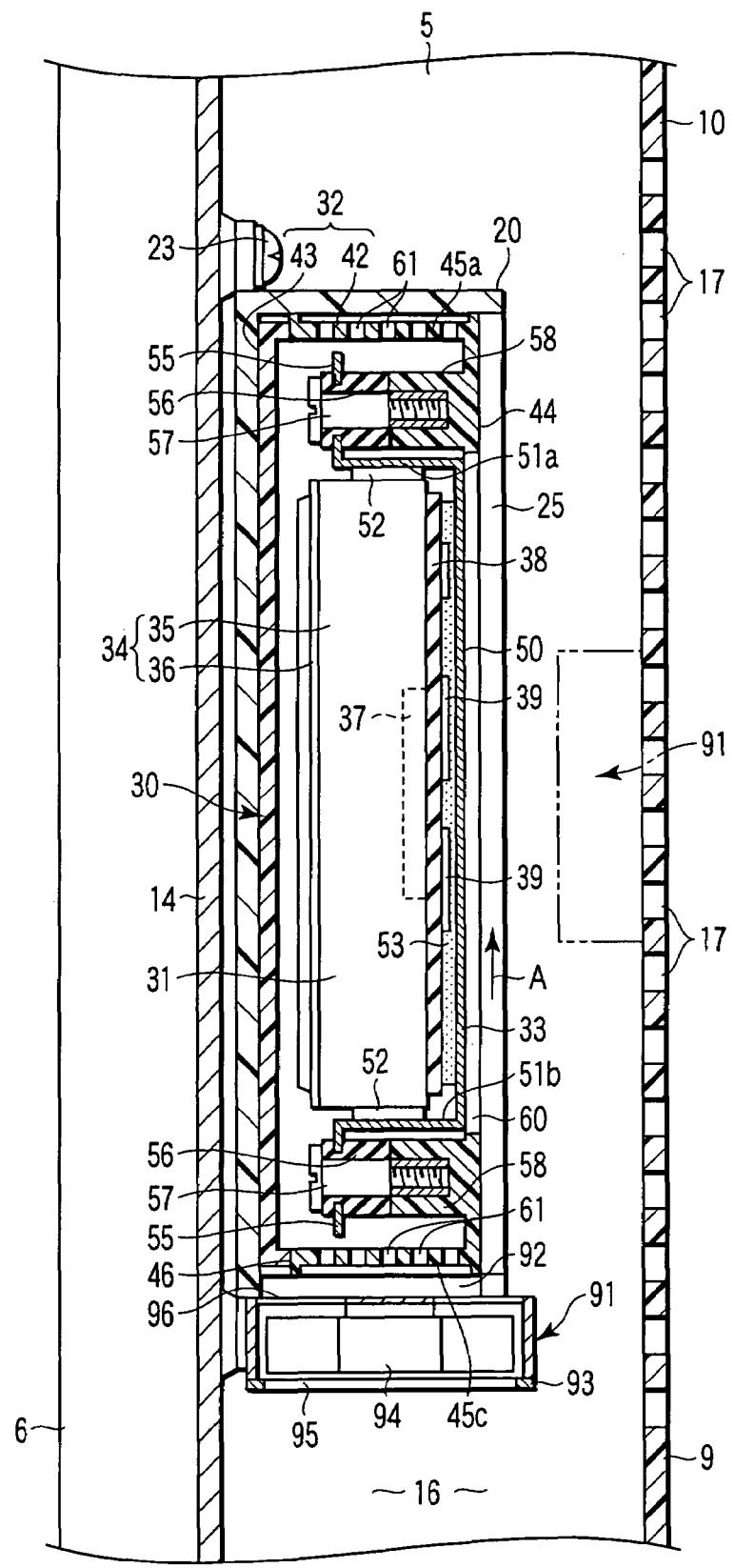
FIG. 11 is an exemplary cross-sectional view illustrating a state where an HDD unit is inserted into an HDD holder in a third embodiment of the present invention.

FIG. 11 discloses a third embodiment of the present invention.

The third embodiment discloses a structure suitable for cases where the heat generation amount of the HDD 31 is larger than those in the first and the second embodiments.

As illustrated in FIG. 11, the HDD holder 20 is provided with a motor-driven cooling fan 91. The cooling fan 91 is attached to an air supply hole 92 located at the bottom of the HDD holder 20. The cooling fan 91 has a fan casing 93, and an impeller 94 contained in the fan casing 93.

An air inlet 95 and an air outlet 96 are formed in the fan casing 93. The air inlet 95 is opened to the receptacle 16 of the housing 5, and the air outlet 96 is opposed to the air supply hole 92 of the HDD holder 20. The impeller 94 is located between the air inlet 95 and the air outlet 96.

When the impeller 94 is rotated, the air in the receptacle 16 is taken into the fan casing 93 through the air inlet 95. The air taken into the fan casing 93 serves as cooling air, and is blown on the HDD unit 30 from the air outlet 96 through the air supply hole 92. The cooling air flows into the case 32 through the heat-radiating ports 61 at the bottom of the case 32, passes around the HDD 31, and is discharged from the heat-radiating ports 61 at the top of the case 32.

Further, by rotation of the impeller 94, a flow of air going from the bottom to the top is generated inside the receptacle 16 of the housing 5, as indicated by arrow A in FIG. 11. Thereby, the heat-radiating portion 50 of the bracket 33, which is exposed to the receptacle 16, is directed exposed to the flow of air, and cooled by the air.

According to the third embodiment having the above structure, the HDD 31 having a large heat generation amount can be forcibly cooled by cooling air supplied from the cooling fan 91. Simultaneously, the heat-radiating portion 50 of the bracket 33 can be forcibly cooled by the flow of air generated in the receptacle 16.

Therefore, the effect of cooling the HDD 31 is further enhanced, and the operation circumstance temperature of the HDD 31 is maintained at proper temperature.

Although the cooling fan 91 is attached to the HDD holder 20 in the third embodiment, the present invention is not limited to it. For example, as indicated by a chain double-dashed line in FIG. 11, the cooling fan 91 may be attached to the rear wall 10 of the back cover 9, so that cooling air supplied from the cooling fan 91 is directly blown on the heat-radiating portion 50 of the bracket 33.

Further, the display device of the present invention is not limited to liquid crystal televisions, but the present invention can also be carried out for plasma televisions or monitors of desk-top personal computers in the same manner.

While certain embodiments of the inventions have been described, there embodiments have been presented by way of example only, and are not intended to limit the scope of the invention. Indeed, the novel methods and systems described herein may be embodied in a variety of other forms; furthermore various omissions, substitutions and changes in the form of the methods and systems described herein may be made without departing form the spirit of the inventions. The accompanying claims and their equivalents are intended to cover such form or modifications as would fall within the scope and sprit of the inventions.

What is claimed is:

1. A display device comprising:
   a housing;
   a display panel housed in the housing;
   a chassis which holds the display panel inside the housing; and
   a hard disk drive (HDD) unit which is housed inside the housing and located behind the display panel, wherein the HDD unit includes:
   (i) a case which is supported by the chassis and has an opening portion opened toward rear of the display panel;
   (ii) a hard disk drive (HDD) which is housed inside the case and has a heat-generating portion generating heat during operation, the heat-generating portion being provided on a side of the HDD, which is opposite to a side of the HDD facing the display panel; and
   (iii) a bracket which holds the HDD inside the case, the bracket having thermal conductivity and having a heat-radiating portion thermally connected to the heat-generating portion of the HDD, the heat-radiating portion being exposed to inside of the housing through the opening portion of the case on the side of the HDD, which is opposite to the side of the HDD facing the display panel.

2. The display device according to claim 1, wherein the heat-generating portion of the HDD is a circuit component mounted on a circuit board and a disk drive motor, and the HDD is supported by the bracket in a position in which the circuit component and the disk drive motor are opposed to the heat-radiating portion.

3. The display device according to claim 2, wherein the circuit board is opposed to the heat-radiating portion, and a heat-conducting member is interposed between the heat-radiating portion and the circuit board.

4. The display device according to claim 1, wherein the heat-radiating portion has a size corresponding to the HDD.

5. The display device according to claim 4, wherein the opening portion of the case has a size corresponding to the heat-radiating portion.

6. The display device according to claim 5, wherein the chassis has an HDD holder into which the case of the HDD unit is inserted, and the HDD holder has a window portion which is opened in a position of the housing corresponding to the opening portion of the case.

7. The display device according to claim 1, further comprising:
a fan which supplies cooling air to the HDD unit.

8. The display device according to claim 1, wherein the heat-radiating portion has a plurality of heat-radiating fins which project from the opening portion of the case into the housing.

9. A display device comprising:
a display panel;
a housing which has a rear wall located behind the display panel;
a chassis which holds the display panel inside the housing; and
a hard disk drive (HDD) unit which is housed between the display panel and the rear wall, the HDD unit including:
 (i) a case which is supported by the chassis and has an opening portion opened toward the rear wall inside the housing;
 (ii) a hard disk drive (HDD) which has a heat-generating portion generating heat during operation, the HDD being housed inside the case with the heat-generating portion directed to the rear wall located behind the display panel; and
 (iii) a bracket which holds the HDD inside the case, the bracket having thermal conductivity and having a heat-radiating portion thermally connected to the heat-generating portion of the HDD, the heat-radiating portion being exposed to inside of the housing through the opening portion of the case on a side of the HDD, which is opposite to a side of the HDD facing the display panel.

10. The display device according to claim 9, further comprising:
a fan which is provided on the rear wall of the housing and supplies cooling air to the heat-radiating portion.

11. The display device according to claim 10, wherein the opening portion of the case has a size corresponding to the heat-radiating portion.

12. A television containing a hard disk drive comprising:
a display panel;
a housing which houses the display panel;
a metal chassis which holds the display panel inside the housing; and
a hard disk drive (HDD) unit which is housed inside the housing and located behind the display panel, the HDD unit including:
 (i) a case which is supported by the chassis and has an opening portion opened toward rear of the display panel;
 (ii) a hard disk drive (HDD) which is housed inside the case and has a heat-generating portion generating heat during operation, the heat-generating portion being provided on a side of the HDD, which is opposite to a side of the HDD facing the display panel; and
 (iii) a metal bracket which holds the HDD inside the case, the bracket having a heat-radiating portion thermally connected to the heat-generating portion of the HDD, and an extending portion extending into a space between the HDD and the chassis, the heat-radiating portion being exposed to inside of the housing through the opening portion of the case on the side of the HDD, which is opposite to the side of the HDD facing the display panel, and the extending portion of the metal bracket is ground-connected to the metal chassis through a metal spring member.

13. The television according to claim 12, wherein the heat-generating portion of the HDD is a circuit component mounted on a circuit board and a disk drive motor, and the HDD is supported by the metal bracket in a position in which the circuit component and the disk drive motor are opposed to the heat-radiating portion.

14. The television according to claim 13, wherein the opening portion of the case has a size corresponding to the heat-radiating portion.

15. The television according to claim 12, wherein the case has a through hole which exposes the extending portion of the metal bracket to a side opposite to a side facing the circuit board, and the metal spring member is attached to the metal chassis, and contacts the extending portion through the through hole when the HDD unit is housed in the housing.

16. The display device according to claim 1, metal bracket which holds the HDD inside the case is ground-connected to the metal chassis.

17. The display device according to claim 9, wherein the metal bracket which holds the HDD inside the case is ground-connected to the metal chassis.

* * * * *